United States Patent [19]

Lazzari

[11] 4,326,267
[45] Apr. 20, 1982

[54] DATA PROCESSING SYSTEM EMPLOYING PORTABLE CARDS AND OPERATING STATIONS MAKING USE OF MAGNETIC BUBBLE ELEMENTS

[75] Inventor: Jean-Pierre Lazzari, Montfort l'Amaury, France

[73] Assignee: Compagnie Internationale pour l'Informatique Cii-Honeywell Bull, Paris, France

[21] Appl. No.: 90,275

[22] Filed: Nov. 1, 1979

[30] Foreign Application Priority Data

Dec. 21, 1978 [FR] France ................... 78 36049

[51] Int. Cl.³ ............... G11C 7/00; G11C 17/08
[52] U.S. Cl. ............................... 365/1; 365/2
[58] Field of Search .............. 235/493, 449; 365/1, 365/2

[56] References Cited

U.S. PATENT DOCUMENTS 3,637,994 1/1972 Ellingboe ............... 235/61.12 N
3,786,445 1/1974 Ho et al. ................. 340/174 TF
4,156,934 5/1979 Burford et al. ................ 365/2

*Primary Examiner*—George G. Stellar
*Attorney, Agent, or Firm*—Kerkam, Stowell, Kondracki & Clarke

[57] ABSTRACT

A credit card or security card data processing system employing portable cards including data processing means in each card adapted to be coupled to a data processing station having its own data processing means. In each card a part of the data processing means is formed by magnetic bubble elements at least one of which is a memory. The magnetic bubble elements are formed in a layer of magnetic material which has a propagation track thereon and which is positioned between a pair of magnet elements which establish a polarizing field perpendicular to the layer. The operating station includes orthogonal conductive coils arranged to set up a rotatable magnetic field which is applied to the magnetic layer causing the bubbles to be attracted by magnetic poles in the propagation track. A magnetoresistive member senses movement of the bubbles.

11 Claims, 3 Drawing Figures

DATA PROCESSING SYSTEM EMPLOYING PORTABLE CARDS AND OPERATING STATIONS MAKING USE OF MAGNETIC BUBBLE ELEMENTS

CROSS REFERENCE TO RELATED APPLICATION

A portable card incorporating magnetic bubble elements in the subject matter of commonly-assigned, co-pending application Ser. No. 090,248, filed Nov. 1, 1979, by Jean-Pierre Lazzari, entitled A PORTABLE CARD INCORPORATING MAGNETIC BUBBLE ELEMENTS. The subject matter of this application is hereby incorporated by reference.

BACKGROUND OF THE INVENTION

1. Field of the invention

The present invention relates to a data processing system employing portable cards and operating stations. It is applicable in particular to the banking and commercial sectors, and/or to control and security systems.

Although the forms which such cards take may vary widely and may encompass, for example, cards in the true sense, rings, keys, tickets, slips, etc., for the sake of simplicity the term "card" will be used herein and is indeed the applicable term in the majority of cases, although it should be appreciated that such use does not imply any limitation of the invention.

2. Description of the Prior Art

Portable card systems are becoming increasingly popular. Such systems comprise data processing means which consists of a plurality of individual cards and at least one shared or common operating station which is generally positioned at a fixed location. Each card comprises, in essence, means for processing data and at least one memory in which is recorded a confidential identity code known only to the rightful holder of the card. The operating station includes means for processing data from the card, together with manual control means, usually formed by a keyboard. With such a system, the holder of a card is able to perform certain monetary or accounting operations the most frequent of which are the issuing of bank notes and the keeping of an account. For this, it is merely necessary for the holder to insert his card in an operating station and then for him to identify the desired operations using the keyboard. These operations can only take place if the user of the card is able to supply the confidential code corresponding to the card being used. This preliminary checking or identification operation enables frauds to be avoided in the event of the card being lost or stolen.

A system of this kind must therefore incorporate a comparator member capable of comparing the code stored in the card with the code transmitted from outside by the user of the card. This comparator member could be situated in the operating station, but it is preferable for it to be arranged in the card to enable it to be compared with the code fed in so as to avoid the necessity of transferring the identify to the exterior, which would diminish the security of the system against fraudulent use.

Portable cards are known in which the data-carrying medium is formed by one or more magnetic tracks. They are for example what are termed "blue cards." In these cards, items of data are represented by the magnetizations exhibited by a plurality of magnetic zones. Generally, the items of data are read, and possibly fresh items of data are written, as the data-carrying medium passes in front of magnetic read and write heads.

Cards of this kind are described, for example, in French Pat. No. 1114901 entitled "Accounting Machines," granted on Dec. 26, 1955.

Cards employing magnetic tracks have many disadvantages. First of all they offer only a small storage capacity. Secondly there is a danger of losing the data recorded, in particular if they are acted on by stray magnetic fields or excessive heat. Finally, and most important, they do not protect against fraudulent use, since it is possible for an expert to detect the confidential code contained in the magnetic track and then to make illicit use of the card for his own advantage.

Attempts have therefore been made to produce portable cards employing non-magnetic data-carrying media which offer greater storage capacity and which make it far more difficult for the secret of the code to be broken. To this end "electronic" cards have been proposed. These are cards in which the code is stored by means of electronic semiconductor circuits. Such cards may, for example, make use of programmable read only memories (PROM).

French Pat. No. 2139258, entitled "Data Cards," granted Dec. 11, 1972 corresponding to U.S. Pat. No. 3,702,464, discloses a card incorporating a memory formed by a matrix of semiconductor diodes. French Pat. No. 2180349, entitled "Device for Identifying a Plurality of Persons Individually," granted Oct. 29, 1977, discloses a card employing a memory produced from integrated circuits of the metal oxide semiconductor (MOS) type.

Reference may also be made to more recent French patent applications and in particular to application No. 74.10191 entitled "Method and Arrangment for Electronic Control," filed Mar. 25, 1974, and application No. 75.14807 entitled "System for the Confidential and Personalized Transfer and Storage of Data Using Independent Portable Electronic Articles." Both these applications disclose cards in which the data carrying medium is formed by a monolithic semiconductor circuit produced by integrated circuit techniques.

As stated in application No. 75.14807, it appeared advantageous for magnetic carrier mediums to be replaced by electronic semiconductor devices because when compared with other read only memories such as magnetic cassettes, floppy discs, etc., monolithic read only memories of the semiconductor type are more reliable, they are smaller in size, require no mechanical movement for reading or writing, are insensitive to magnetic fields, and are difficult to counterfeit and fraudulently use, i.e. a potential fraudulent user has to employ complicated electronic means to alter the state of a read only memory of the semiconductor type.

Although electronic devices of this nature have proved satisfactory in certain respects, they still suffer from disadvantages. For example, the detection of confidential identity code, although difficult, is by no means impossible to an electronics expert. Also, semiconductor memories which are "read only" memories, only permit reading operations.

SUMMARY OF THE INVENTION

The object of the present invention is to provide a portable card system which overcomes the latter disadvantages, the secrecy of which is virtually inviolable, and which contain a "read/write" memory, making it versatile in use.

The invention achieves these objects by making use of magnetic bubble elements. So that this feature of the invention may be properly understood, it will be useful to review briefly the nature of elements of this kind.

In a monocrystalline magnetic layer exhibiting uniaxial magnetic anisotropy perpendicular to the plane of the layer (what are generally used are orthoferrites or certain garnets), it is possible to produce generally cylindrical magnetic domains in which the sense of magnetic induction is opposite from that in the remainder of the layer. These domains, which are conventionally termed "bubbles," can be shifted in the layer. For this purpose the layer is covered with a network of magnetizable metal strips forming a guide track and is subjected to a rotary magnetic field applied in the plane of the layer.

The magnetic bubbles can be shifted to a detecting member, but they may also be held stationary in the layer. To ensure that the bubbles remain stable with time it is necessary to apply to the layer a steady magnetic field, termed a polarizing or stabilizing field, which field must be perpendicular to the layer.

Logic circuits, comparators, memories, and so on may be produced in this way. U.S. Pat. Nos. 2,919,432 discloses a memory of this type.

The use of magnetic bubble elements of a magnetic nature in a portable card goes against and is contrary to the preconceptions of the prior art, as evidenced, for example, by the comments noted above in French application No. 74.14807 suggesting an electronic solution to the problem. Contrary to expectations, the use of magnetic bubble elements endows cards with a performance far superior to that of electronic cards, in particular as regards the maintaining of the secrecy of the identity code.

To be more exact, the present invention comprises a data processing system which employs on the one hand a plurality of portable cards incorporating first data-processing means and on the other hand at least one operating station in which each card can be temporarily inserted. The operating stations incorporate second data processing means and means for coupling the first data processing means to the second. The invention is particularly characterized in that, in each card, some at least of the data processing means are formed by magnetic bubble elements.

Preferably each operating station contains a means for setting up a rotary magnetic field which is applied to the bubble elements of the card when the card is inserted in the station. Also, at least one of the magnetic elements of each card is a memory.

BRIEF DESCRIPTION OF THE DRAWINGS

The features and advantages of the present invention will in any case become clearer from a perusal of the following description of an embodiment, which is given by way of non-limiting example, in which:

Referring to FIG. 1 there is illustrated a portable card C and an associated operating station P.

Figure 1:
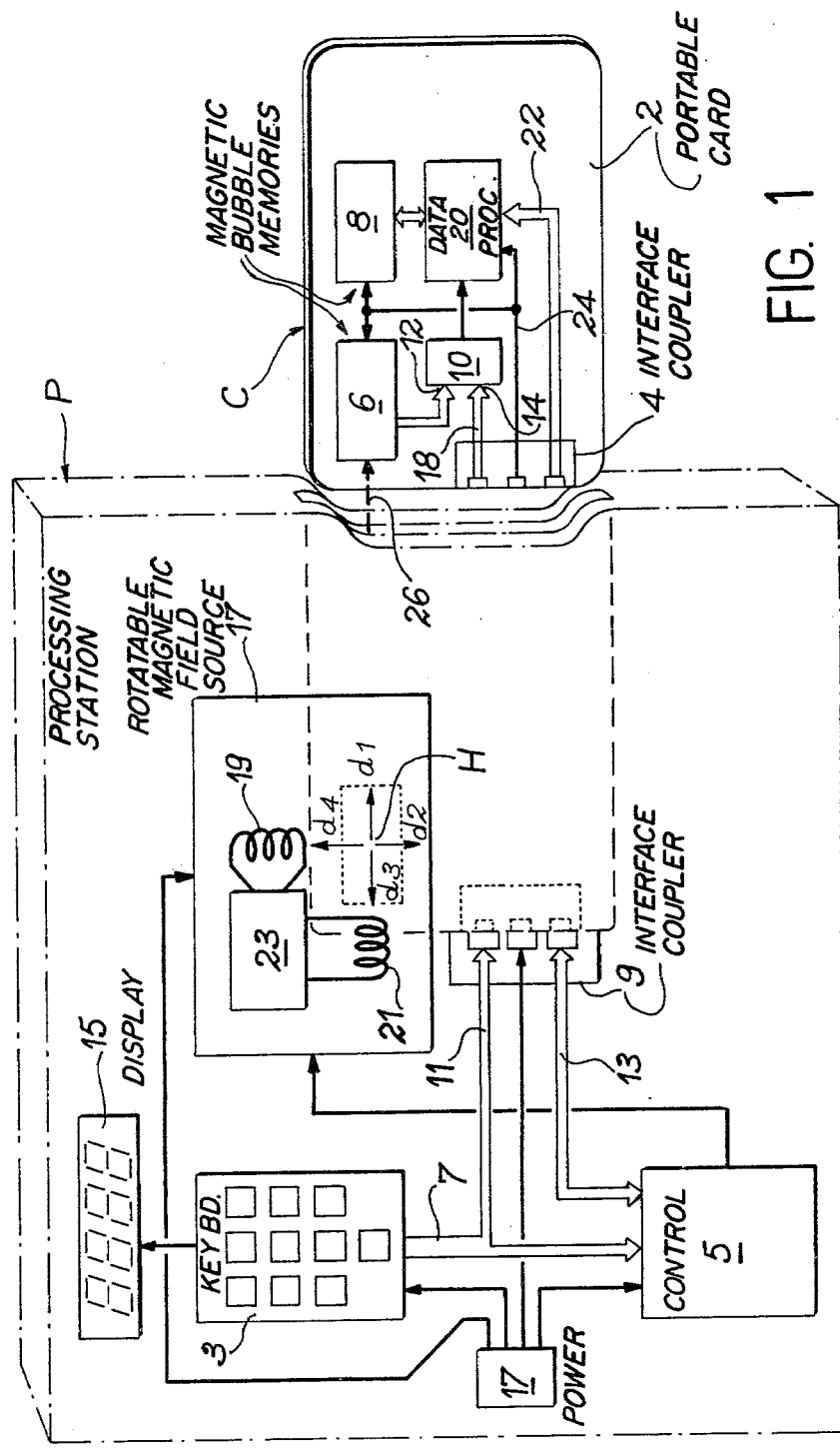
FIG. 1 is a general diagram of an operating station and a portable card according to the invention.

The card comprises, in a known fashion, an insulating base 2 of rectangular shape in which are arranged an interface coupler 4, a first memory 6, whose function is to contain a confidential identity code for the card, a second memory 8 for storying items of data of various kinds, and a comparator 10 having two inputs 12 and 14. Input 12 of the comparator is connected to memory 6 and input 14 to a connecting bus 18 which terminates at the interface coupler 4, card C also includes a data processing circuit 20 which is fed by a bus 22 which is likewise connected to the interface coupler 4, and finally a connection means 24 to interconnect and provide an electrical supply for the memories 6 and 8, the comparator 10 and circuit 20.

The operating station P comprises, in a known fashion, a controlling keyboard 3, an electronic control circuit 5 which is connected to the keyboard by a a bus 7, an interface coupler 9 which is connected to the keyboard by a bus 11 and to the control circuit by a bus 13, an alphanumeric display device 15 which is associated with the keyboard 3, and a power supply 17 which is connected to the keyboard 3, the circuit 5 and the interface coupler 9. Each operating station may possibly be adapted to accept a number of cards at the same time; however, only one entry station is depicted.

The system may also include means for automatic insertion and extraction of the card. These are well known and have therefore not been shown.

The manner in which the invention operates is as follows. When the card is first issued, an identity code is recorded in the memory 6 by means of a write connection 26 (shown as a broken line) which is then removed. The code thus becomes inaccessible from outside the card. To use the card, the holder inserts it in the processing station and then, by using the keyboard, he composes the identity code for the card which has been inserted. This code travels via the bus 11, the interface coupler 9 of the operating station, the interface coupler 4 of the card, and the bus 18 and finally reaches input 14 of the comparator 10. The comparator also receives, at its input 12, the code recorded in memory 6. If, and only if, the two codes are the same, the comparator 10 emits from its output an authorizing signal which is transmitted to the processing circuit 20. The latter is then able to process the instructions and data which it receives from the bus 22 which is connected to the bus 13 coming from the control circuit 5 of the operating station. The auxiliary memory 8 is used to store the data and results which are produced by the operations which are performed.

The structure and operation of the data processing means which have just been mentioned will not be described in any greater detail since they are familiar to those skilled in the art. For a more detailed exposition reference may be made to the prior art documents cited above, which may be considered as forming part of the present specification since they establish what is known in the prior art and the departure from or improvement thereto by the present invention.

Figure 2:
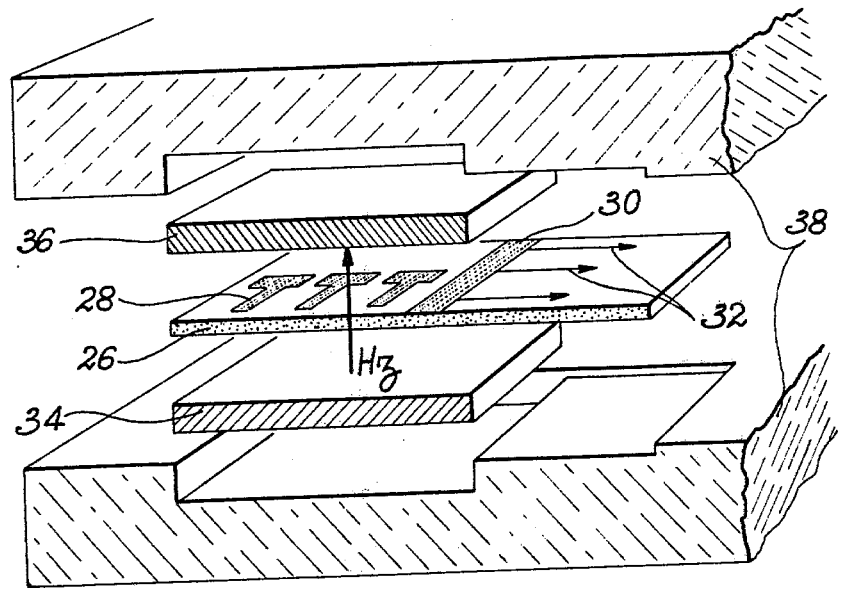
FIG. 2 is an exploded view in cross section of a card according to the invention.
Figure 3:
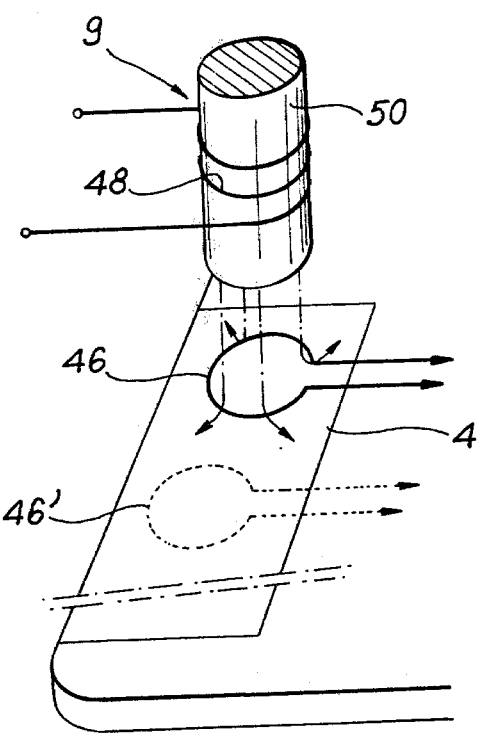
FIG. 3 shows a particular embodiment of interface coupler.

Referring to FIGS. 1–3, the novel data processing means of the invention will now be described.

In accordance with the invention, at least one means for processing data is incorporated in the portable card and comprises a magnetic bubble element. The processing means involved may include memories 6 and 8, comparator 10 and/or the processing circuit 20 for example. A means of setting up a rotatable magnetic field capable of moving the bubbles in such an element is arranged in the operation station P, where it is identified by reference character 17. The means in question comprises two windings 19 and 21 whose axes are mutually perpendicular and which are supplied with power by a current source 23. These two windings set up a rotatable magnetic field H which assumes in succession the orientations which are represented by arrows $d_1$, $d_2$, $d_3$ and $d_4$. The position of the windings 19 and 21 in the fixed station is such that the magnetic field H is applied to the bubble element when the card C is inserted into the station P. In the remaining description, it will be assumed by way of illustration that the bubble element is the memory 6 containing the identity code.

FIG. 2 is a schematic exploded view in cross-section of part of a portable card which includes a bubble element. For the sake of clarity, the items shown in this Figure are not shown in their correct proportions and are greatly exaggerated.

The means shown in this Figure comprise a layer 26 of a magnetic material capable of forming a bubble element (such as orthoferrite or garnet). This layer is overlaid by a propagation track 28 and is provided with means for generating, detecting and erasing magnetic bubbles. The latter means is represented symbolically by an element 30 from which extend connections 32. The magnetic layer 26 is inserted between two flat magnets 34 and 36, positioned in slots in covering layer 38. Magnets 34, 36 set up perpendicularly to the plane of layer 28 a steady magnetic polarizing field Hz which is capable of keeping the bubbles in the layer 26 stable. All these elements are enclosed in, and may be bonded into, a protective shell formed by layer 38 which forms a flat package enabling the card to be handled without any risk of damage to its elements.

The confidential data stores in such an element cannot be detected. The only way of detecting the presence and position of the magnetic bubbles contained in the layer 26 would in fact be to examine the layer with a piece of equipment capable of detecting the direction of a magnetic induction, such as a piece of equipment utilizing the Kerr effect. However, such an examination could only be made if the two permanent magnets 34 and 36 were first removed, which would at once remove the polarizing field and destroy the bubbles.

Thus, any attempt at a physical examination of the layer 26 results in the destruction of the data which it contains. This advantage is unique to a bubble memory since with electronic memories it is always possible, using improved means of examination, to determine the content of the memory without destroying the data which is being sought.

As regards the specific means used to produce a bubble element, a wide variety of possibilities exist. Reference may be made on this subject to, for example, French patent application No. 71.31084 filed Aug. 20, 1971, an application, No. 71.35367 corresponding to U.S. Pat. No. 3,792,451, for a certificate of addition to the latter patent was filed on Sept. 28, 1971. Reference may also be made to French patent application No. 72.44640 filed Dec. 4, 1972, and French patent application No. 75.26029, filed Aug. 22, 1975. It is therefore only for the sake of illustration that FIG. 2 shows certain particular means which comprise a propagation track formed by T-shaped electrodes.

A magnetoresistive member, i.e. a member whose resistance depends on the magnetic field which is applied to it, may be used as the means for detecting the bubbles. When a rotatable magnetic field is applied to the magnetic layer, the bubbles which the layer contains are attracted in turn by the poles which appear in the electrodes of the propagation track. They thus travel under the electrodes and pass close to the magnetoresistive member. The passage of a magnetic bubble past such a member causes a change in the induction to which the member is exposed and this produces a change in its resistance and thus a change in the voltage present at its terminals (assuming the current which it carries to be constant). Thus, in the final analysis, the passage of a bubble past the magnetoresistive member produces a change in voltage which can be detected by a measuring device.

The coupling means with which the card and the fixed station are respectively provided may be of any suitable kind and may, for example, consist of connectors employing metal strips, retractable plungers or metal-plated surfaces. However, in an advantageous version, the means are of the inductive type as shown in FIG. 3.

The means which are shown in FIG. 3 comprise in the case of the coupler 4 of the card, a plurality of loops 46 (only one of which is shown). These loops are connected to the various circuits of the card. In the case of the coupler 9 of the operating station, multi-turn windings 48 are provided with a magnetic core 50 (of ferrite or mu-metal for example). The loops 46 and corresponding winding 48 are coupled by mutual induction when the card is inserted in the operating station.

In operation, when an item of data or a supply current is transmitted from the station to the card, winding 48 is fed with an alternating current of high frequency (for example in the region of 500 kHz or 1 MHz), which, by induction, gives rise in loop 46 to a current of the same frequency which is then fed to the circuits of the card, possibly after rectification. When transmission takes place in the opposite direction, it is an alternating current flowing in loop 46 which induces an alternating voltage in winding 48, the combination this time acting as a voltage step-up circuit.

If the card is likely to be subjected to varying stray magnetic fluxes, each loop 46 of the interface coupler 4 may have associated with it a compensating loop 46', which, like loop 46, is exposed to the said varying fluxes. The signals emitted by loops 46 and 46' are then substracted from one another, the difference signal being free of the effect of the stray fluxes.

Finally, rather than using a compensating loop in the interface coupler of the cards, each loop might possibly have associated with it a threshold circuit such that the threshold of the circuit was never reached as a result of stray inductions alone.

I claim:

1. A data processing system adapted to employ a plurality of portable cards for processing information between said cards and an operating station, each said card including first data processing means, magnetic bubble elements forming a part of said first data processing means, said operating station including second data processing means, receiver means into which said cards may be inserted and means for coupling the first and the second data processing means upon insertion of a card into said receiver means, and said operating station having means positioned for setting up a rotatable magnetic field to be applied to the magnetic bubble elements of the card upon insertion of said card in the receiver means and coupling of the first and second data processing means.

2. A data processing system according to claim 1, wherein the means for setting up a rotatable magnetic field comprises two mutually orthogonal conductive coils.

3. A data processing system according to any one of claims 1, or 2, wherein the means for coupling an operating station to a card inserted into the station comprise conductive loops coupled by mutual induction.

4. A data processing system according to claim 1, or 3, wherein at least one of the magnetic bubble elements in each card is a memory.

5. A data processing system according to either of claims 1, or 2, wherein said magnetic bubble elements comprise a layer of magnetic material containing magnetic bubbles, said layer having a propagation track therein and means for detecting the bubbles, and each said cards further including means for setting up a magnetic polarizing field perpendicular to the said layer.

6. A data processing system according to claim 5, wherein the means for coupling an operating station to a card inserted into the station comprises conductive loops coupled by mutual induction.

7. A data processing system according to claim 4, wherein the means for coupling an operating station to a card inserted into that station comprises conductive loops coupled by mutual induction.

8. A data processing system comprising a data processing station having first data processing means, receiver means for receiving a portable card and means disposed for establishing a rotating magnetic field at said processing station adapted to be operatively associated with a card inserted into said receiver means, a plurality of portable cards for processing information between a card and the processing station, each said card comprising second data processing means for processing data, at least part of said second data processing means including a magnetic bubble memory adapted to have written therein by said rotating magnetic field an identity code, said identity code upon being written into the memory being inaccessible from outside the card, coupler means on said card for interfacing with the receiver means at said processing station to enable the flow of data between a card and said processing station upon insertion of the card into the receiver means and identification of said identity code and said second processing data means including a comparator connected between said coupler means and said magnetic bubble for comparing the identity code with an identity code applied to the coupler means from said first data processing means and authorizing the flow of data when the two codes are identical.

9. A data processing system as set forth in claim 8 wherein said means for establishing a rotating magnetic field is located at said processing station but physically separate from said receiver means in which said card is inserted.

10. A data processing system as set forth in claim 8 wherein the second data processing means further includes a processor circuit having one input connected to receive an authorizing signal from said comparator and a second input connected to receive data signals applied to said comparator from said first data processing means through said receiver means.

11. A data processing system as set forth in claim 8 including power connection means between said coupler and said first data processing means for supplying power to said first data processing means.

* * * * *

UNITED STATES PATENT AND TRADEMARK OFFICE
CERTIFICATE OF CORRECTION

PATENT NO. : 4,326,267
DATED : April 20, 1982
INVENTOR(S) : Jean-Pierre Lazzari

It is certified that error appears in the above-identified patent and that said Letters Patent are hereby corrected as shown below:

In Claim 4, column 7, line 1, cancel "3" and substitute --2--.

Signed and Sealed this

Twenty-seventh Day of July 1982

[SEAL]

Attest:

*Attesting Officer*

GERALD J. MOSSINGHOFF

*Commissioner of Patents and Trademarks*